(12) United States Patent
Ge

(10) Patent No.: US 6,681,100 B1
(45) Date of Patent: Jan. 20, 2004

(54) SMART AMPLIFIER FOR TIME DIVISION DUPLEX WIRELESS APPLICATIONS

(75) Inventor: David Ge, Potomac, MD (US)

(73) Assignee: Teletronics International, Inc., Rockville, MD (US)

(*) Notice: Subject to any disclaimer, the term of this patent is extended or adjusted under 35 U.S.C. 154(b) by 0 days.

(21) Appl. No.: 09/524,745

(22) Filed: Mar. 14, 2000

Related U.S. Application Data

(60) Provisional application No. 60/124,365, filed on Mar. 15, 1999.

(51) Int. Cl.[7] .................................................. H04B 1/44
(52) U.S. Cl. ........................ 455/78; 455/115; 455/127
(58) Field of Search ................................ 455/134, 13.4, 455/69, 38.2, 73, 127.1, 127.2, 522, 78, 83, 115.1, 115.3; 375/99; 325/402; 381/321

(56) References Cited

U.S. PATENT DOCUMENTS

| | | | | |
|---|---|---|---|---|
| 3,569,840 A | * | 3/1971 | Tanaka | 325/402 |
| 4,178,548 A | * | 12/1979 | Thompson | 455/78 |
| 4,392,245 A | * | 7/1983 | Mitama | 455/115.1 |
| 4,810,101 A | * | 3/1989 | Kage et al. | 375/99 |
| 4,835,494 A | | 5/1989 | Preschutti | |
| 4,849,963 A | | 7/1989 | Kawano et al. | |
| 4,970,722 A | | 11/1990 | Preschutti | |
| 5,805,979 A | * | 9/1998 | Miyashita | 455/38.2 |
| 5,867,769 A | * | 2/1999 | Ichiyanagi | 455/69 |
| 5,918,164 A | * | 6/1999 | Takahashi et al. | 455/134 |
| 6,011,980 A | | 1/2000 | Nagano et al. | |
| 6,088,573 A | * | 7/2000 | Tsuda | 455/13.4 |
| 6,198,830 B1 | * | 3/2001 | Holube et al. | 381/321 |
| 2001/0023177 A1 | * | 9/2001 | Tanaka | 455/73 |

OTHER PUBLICATIONS

"Smart Amplifier Remote Bi-Directional Power Amplifiers for 2.4 GHz User and Installation Manual", Teletronics International, Inc. 1998. pp. 1–9.*

Model AMP2440 Remote Bi-Directional Power Amplifiers for 2. GHz User and Installation Manual, Young Design, Inc. Feb. 1998, vol. 1.4, pp. 1–9.*

* cited by examiner

*Primary Examiner*—Erika Gary
(74) *Attorney, Agent, or Firm*—Cahn & Samuels, LLP

(57) ABSTRACT

A bi-directional antenna-mount amplifier particularly suited to be compatible with a broad range of advanced spread spectrum TDD wireless applications relying on either direct sequence or frequency hopping, at a wide range of frequencies, and which allows the radio device sharing of an associated antenna in different time intervals, where signal distortion is minimized due to operation of the amplifier which is governed by an equation and associated gain control circuits to maintain constant output power and prevent transmit signal saturation.

19 Claims, 4 Drawing Sheets

RF POWER DETECTION AND GAIN CONTROL OPERATION

RF POWER DETECTION AND GAIN CONTROL OPERATION

SCHEMATIC OF THE RF LEVEL DETECTION AND GAIN CONTROL CIRCUITS

SMART AMPLIFIER FOR TIME DIVISION
DUPLEX WIRELESS APPLICATIONS

This application claims priority to Provisional Application Serial No. 60/124,365 filed Mar. 15, 1999.

BACKGROUND OF THE INVENTION

1. Technical Field

This invention relates to wireless applications using Time Division Duplex (TDD) technology in Wireless Local Area Network (WLAN), Wireless Local Loop (WLL), Wireless Internet Access (WIA), wireless modem connection with point-to-point and point-to-multipoint applications.

2. Description of the Related Art

Typically in wireless applications, adding on an antenna amplifier and DC injector is a purchaser option. However, when the operating range of wireless applications is long as, for example, between buildings on a campus, the inclusion of an add-on antenna amplifier/DC injector set may become necessary in order to preserve transmission quality. As is well known by persons in the art, every system presents its own set of considerations. For example, different site environments magnify the significant technical, architectural, and environmental differences between different hardware. In many such instances, the use of conventional amplifiers is limited and a single amplifier design cannot and does not have a sufficient useful range to meet many typical applications.

Attenuation between a DC injector and bi-directional amplifier can range from a few dB to more than 20 dB, losses which may be compounded further from substantial cable interconnection lengths running to hundreds of feet. Furthermore, output power from different radio modems vary which requires component matching in order to avoid undesirable additional losses. In view of such considerations, conventional amplifiers require the system installer to carefully evaluate and measure the input RF power at the antenna amplifier and specify the gain of the amplifier. Thus, in order to achieve and maintain acceptable system performance, conventional applications often require the use of different amplifiers with different systems to meet the specific ambient operating criteria. Failure to exercise careful installation and engage in proper maintenance can cause serious operational degradation.

SUMMARY OF THE INVENTION

Accordingly, it is an object of the present invention to overcome the problems associated with the prior art.

It is another object of this invention to provide an amplifier maximizing operational capabilities so as to be usable in a broad range of situations and adapted for use over a wide input power range.

A further object of this invention to provide an amplifier that is capable of flexible operational parameters so as to be usable with a broad range of hardware and in a broad range of operational environments.

Still another object of this invention is to provide a standardized amplifier structure which is economical to install and to maintain.

Yet another object of this invention is to provide an amplifier possessing self-adjusting transmit gain.

A further object of this invention is to provide an amplifier embodying an equation providing for self adjustment of amplifier transmission gain.

A further object of this invention is to maintain constant power levels and minimize signal distortion.

These and other objects are satisfied by a combination of an RF antenna, a bi-directional RF amplifier module, a DC injector, a cable, a power supply, and wireless equipment, said RF amplifier module including an RF input power sensor, an RF power level detector for determining if the RF power level is below a select threshold, a transmit gain control circuit, and at least a first and a second switches, said DC injector being connected to said RF amplifier module by said cable and said wireless equipment which may include a radio modem, said cable capable of carrying a bi-directional RF signal and DC power between the amplifier module and the antenna, where the amplifier switches from a transmit mode to a receive mode when the RF power is below said select threshold to maintain substantially constant output power.

Still other objects are satisfied by the method for maintaining substantially constant output from an RF amplifier independent of input power levels where the amplifier operates to produce $$P_{out}=C \cdot K \cdot 10^{VR} \cdot 10^{-B \cdot Log(P_{in})} \cdot P_{in}=C \cdot K \cdot 10^{VR+B}$$

where B and C are constants, K is the constant amplifier gain, VR is a fixed reference voltage, $P_{in}$ is the RF input power level, and $P_{out}$ is the output power.

The present invention, in short, provides for both power level detection and automatic gain control. The invention contemplates automatically (intelligently) adapting the gain to the input power level, cable, and connector loss due to the particular lengths and configuration of a set up. The invention is particularly useful in TDD wireless applications as the circuitry permits the output power level to be intelligently monitored and maintained whereby desired performance can be achieved regardless of the details of the particular TDD hardware configuration and/or installation environment.

The invention is particularly a cost effective solution for "last-mile" applications, e.g. connectivity between office buildings, for remote monitoring and in rural areas. Presently, the invention is designed for use with direct sequence or frequency hopping spread spectrum radio modems (or wireless equipment such as LAN cards) to boost transmit power amplification and receive signal gain. By including a dynamic power sensor in an amplifier constructed according to the invention, the RF power output level is adjusted by detecting the input signal power. This automatic gain adjustment minimizes distortion and maximizes output power regardless of variations in input levels.

By exploiting the automatic gain control technique of the invention, an antenna amplifier can detect the input power level, automatically adjust its gain, maintain the output power to a specified level, minimize the signal distortion, and maximize transmission distance. Moreover, standardization, simplicity, and low cost, give this invention an advantage over conventional, "non-intelligent" amplifier structures and methods, particularly as applied to TDD wireless applications.

As used herein "connected" includes physical, whether direct or indirect, hardwired or wireless, or any operationally functional connection.

As used herein "substantially" is a relative modifier intended to indicate permissible variation from the characteristic so modified. It is not intended to be limited to the absolute value or characteristic which it modifies but rather approaching or approximating such a physical or functional characteristic.

Given the following detailed description, it should become apparent to the person having ordinary skill in the art that the invention herein provides an antenna mountable, bi-directional amplifier designed to match advanced spread spectrum direct sequence or frequency hopping systems, and to permit extension of the operating range in wireless environment, at for example, frequencies of 900 MHz, 2.4 GHz, and 5.8 GHz (corresponding to current advanced spread spectrum system operational frequencies). In simplest terms the inventive amplifier herein embodies an intelligent algorithm, preferably, combined with Automatic Gain Controlled (AGC) circuits to maintain the output power and prevent transmit signal saturation. The gain automatically adjusts to minimize the signal distortion by sensing input power with an RF so that the desired signal quality can be assured. Moreover, because the invention utilizes TDD mode, it permits a radio device sharing in different time intervals of an antenna with which the amplifier is associated.

DESCRIPTION OF THE PREFERRED EMBODIMENT

Figure 1:
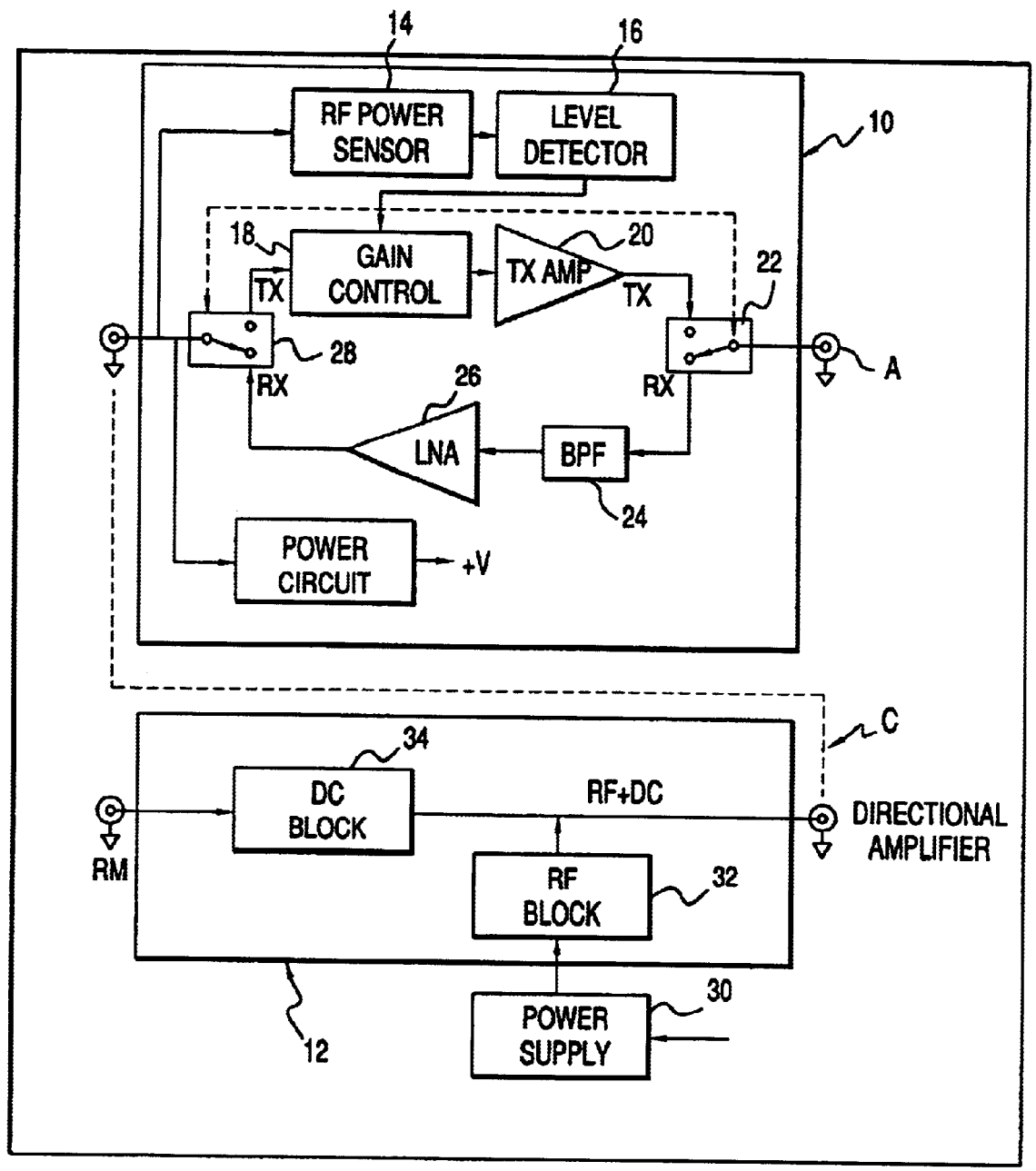
FIG. 1 is a functional block diagram of the illustrated embodiment of the invention.

As illustrated in functional block diagram FIG. 1, the invention comprises a bi-directional amplifier unit 10 connected to an antenna A and a DC Injector unit 12 via a bi-directional cable C (communicating RF signal and DC power to antenna amplifier) where the DC injector is connected to a wireless radio unit which for the purposes of illustration and not limitation is identified as a radio modem RM herein. The amplifier includes a power detection module comprising an RF power sensor 14 and a power level detector 16. The power level detector 16 connects to a variable attenuator gain control module 18, the output of which is fed to a transmitting amplifier 20 which in turn amplifies its output to a transmit/receive switch 22. The switch 22 operatively connects the amplifier unit to the RF antenna A and also toggles between a transmitting mode and receiving mode. When in a receiving mode, the switch directs the antenna input to a bandpass filter 24 followed by a low-noise amplifier 26. The output of the low noise amplifier 26 is directed to a second transmit/receive switch 28. The switch 28 toggles between outputting to the gain control module 18 when in the transmit mode, and the DC injector 12.

The DC injector 12 which is operatively connected via cable C to bi-directional amplifier unit 10, includes an AC power supply input 30 and a RF blocking filter 32 that are connected to the cable input/output from the bi-directional amplifier unit 10 to provide a signal boost. That same pathway includes a further connection to a DC blocking filter 34 and the target radio modem RM.

Figure 2:
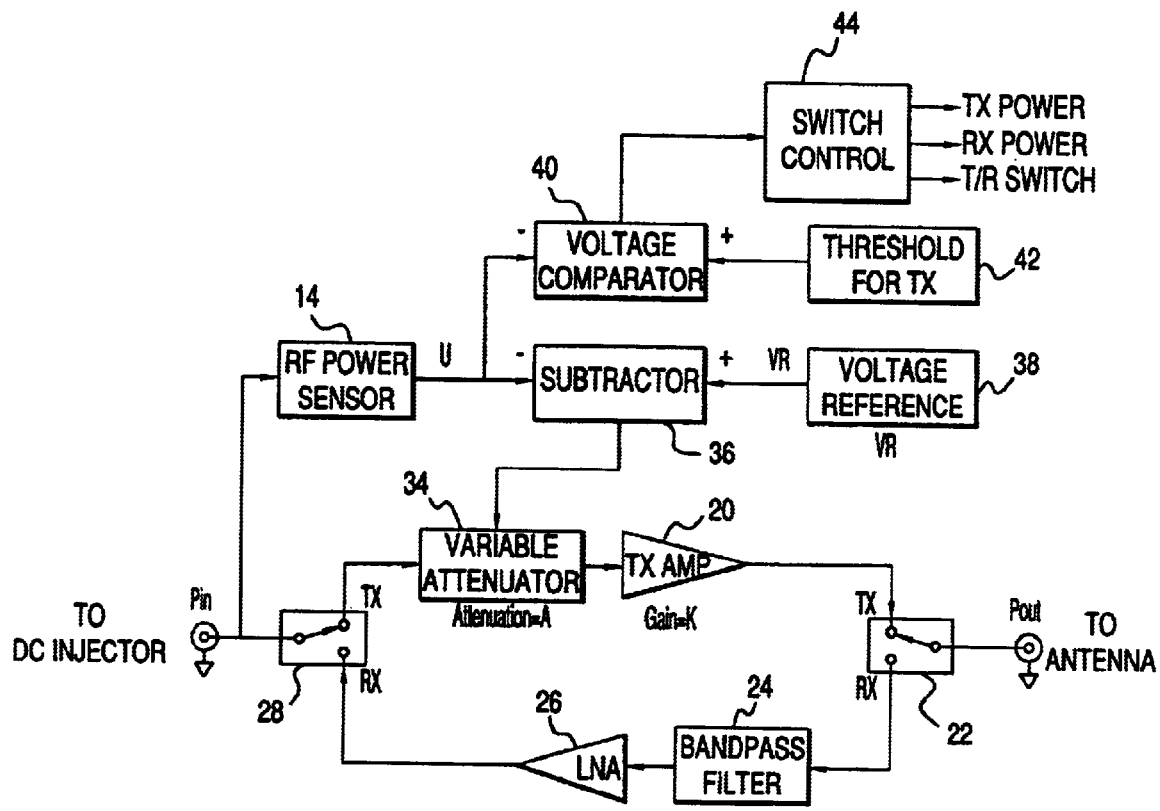
FIG. 2 is a block diagram of the RF level detection and gain control operation of the illustrated embodiment of the invention.

FIG. 2 is a more detailed functional block diagram of the power detection and gain control block diagram. The gain control circuit 18 includes a variable attenuator 34 that is provided an input from a subtractor 36. The subtractor 36 has two inputs, one from the power sensor 14 designated U and the other from reference voltage source 38 designated VR. The subtractor identifies the voltage variation from the established reference voltage VR of the voltage of the input RF power from the sensor 14. A voltage comparator 40 is also connected to the RF voltage output from the power sensor 14. The voltage comparator 40 provides an output to a switch controller 44 which signals the transmit/receive switches 22 and 28 to switch between the transmit and receive modes depending on the output voltage. That voltage is determined by the comparison of an established transmission voltage threshold provided by element 42 and the sensed power input U from power sensor 14. The amplifier unit 10 thereby switches from transmit to receive mode automatically when the RF power is below the threshold level.

The functionality of the unit represented by the block diagram is resolvable and understood by the following algorithmic treatment.

Where RF power sensor and level detector output is designated U, the characteristic of the RF power sensor can be described as follows:

$$U = B \cdot \text{Log}(P_{in}) \tag{1}$$

where B is a constant and $P_{in}$ is the input RF power level.

The output power $P_{out}$ is definable as:

$$P_{out} = A \cdot K \cdot P_{in} \tag{2}$$

where A is the gain of the attenuator, which is the function of its control voltage and K is the constant gain of the amplifier.

The RF sensor controls the variable attenuator according to the following equation:

$$A = C \cdot 10^{(VR-U)} = C \cdot 10^{(VR-B \cdot \text{Log}(P_{in}))} \tag{3}$$

where C is another constant.

Substituting equation 2 with equation 3 produces:

$$P_{out} = C \cdot K \cdot 10^{VR} \cdot 10^{-B \cdot \text{Log}(P_{in})} \cdot P_{in} = C \cdot K \cdot 10^{VR+B} \tag{4}$$

The voltage reference output is constant, e.g., a fixed reference voltage. Because it does not change, the final output $P_{out}$, under the foregoing, remains constant. It is this functionality upon which the invention is based; the amplifier remains at predetermined output power level regardless the RF input power level $P_{in}$. In addition to the hardwired, hardware format of illustrated embodiment, this equation may be implemented via software, by permanent incorporation into an application specific integrated circuit (ASIC), or subject to a masking procedure in the case of large scale mass production.

Figure 3:
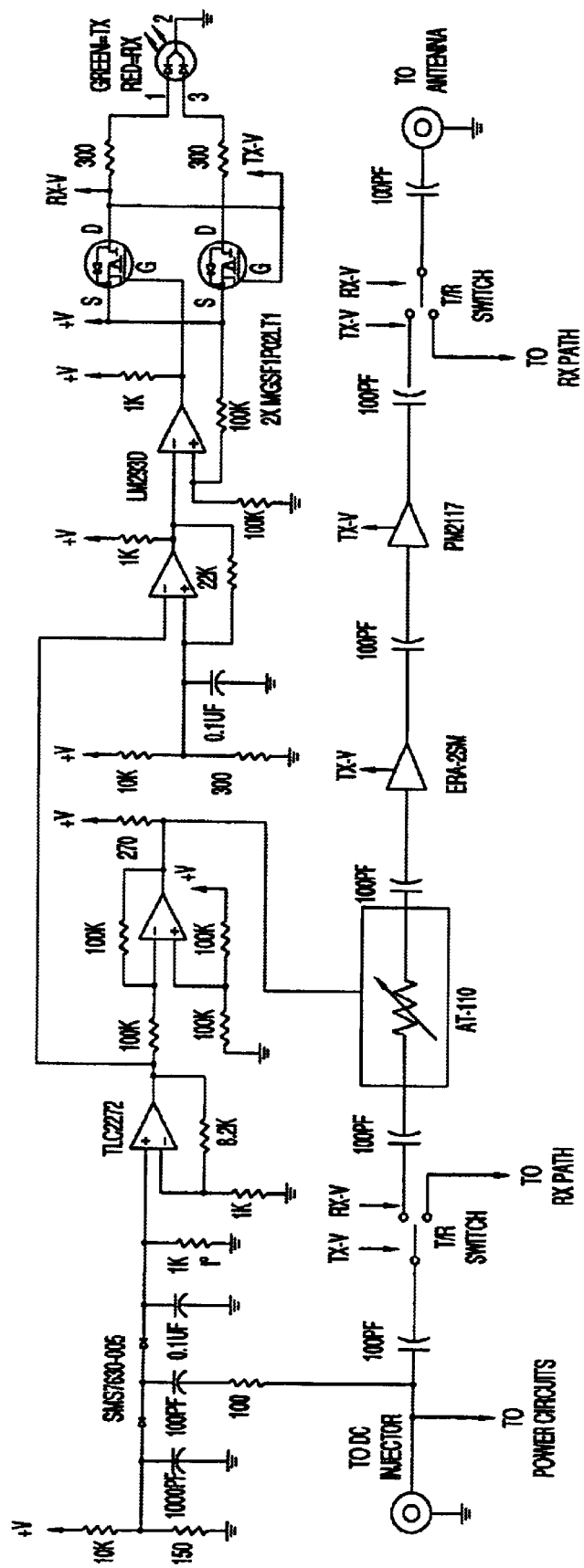
FIG. 3 is the schematic of the RF level detection and gain control circuits of the illustrated embodiment of the invention.

A schematic disclosing specific circuitry for achieving the invention herein is detailed in FIG. 3. The specifics of the schematic are not intended to be limiting but only illustrative of one embodiment of the invention.

In its current embodiments, amplifiers according to the present invention are available at three frequency ranges; 900 MHz, 2.4 GHz, and 5.8 GHz. The invention is not limited to these ranges which represent authorized RF transmission frequencies. The following tables provide performance and specifications for the presently available commercial amplifiers according to the invention at the foregoing operational frequencies:

|  | 900 MHz | 2.4 GHz | 5.8 GHz |
| --- | --- | --- | --- |
| Operating Range | 902–928 MHz | 2400–2500 MHz | 5725–5875 MHz |
| Operating Mode | Bi-directional half-duplex Time Division Duplex. Senses RF carrier from transmitter and automatically switches from receive to transmit mode | | |
| Transmit Gain | 26 dB max. (automatically adjusted) | | 17 dB max. |
| Frequency Response | ± 1 dB over operating range | | |
| Output Power | 4 Watts (+36 dBm) nominal | 500 mW (+27 dBm) nominal | 1.0 W (+30 dBm) nominal |
| TX Input Power | 10 mW (10 dBm) minimum, up to 500 mW (+27 dBm) max | 1 mW (0 dBm) minimum, up to 200 mW (+23 dBm) maximum | 0.5 mW (−3 dBm) minimum, up to 25 mW (+14 dBm) maximum |
| Receiver Gain | 24 dB typical | 14 dB typical | 10 dB typical |
| Noise Figure | 3.5 dB typical | | |
| Power Consumption from power supply | 1.7 A @ 12V DC or 105–240V AC | 650 mA @ 12V DC or 105–240V AC | 1.7 A @ 12V DC or 105–240V AC |
| Operating Temp. Bi-directional Amp. | −20° C. to +70° C. | | |
| Operating Temp. 12V DC Injector | −30° C. to +70° C. | | |
| Humidity Bi-directional Amp. | up to 100% Relative Humidity | | |
| Humidity 12V DC Injector | 10% to 75% Relative Humidity | | |

The foregoing operational table demonstrates that the present invention is ideal to increase the range of low power devices like LAN cards, low power radio modems and to recover the cable losses resulting from installation. The foregoing example of a 900 MHz unit in accordance with the invention is capable of full output power of substantially constant 4 Watts from as little as a 10 mW input. The 2.4 Gz version, described above, is capable of providing a substantially constant 500 mW output from only a 2 mW input.

Figure 4:
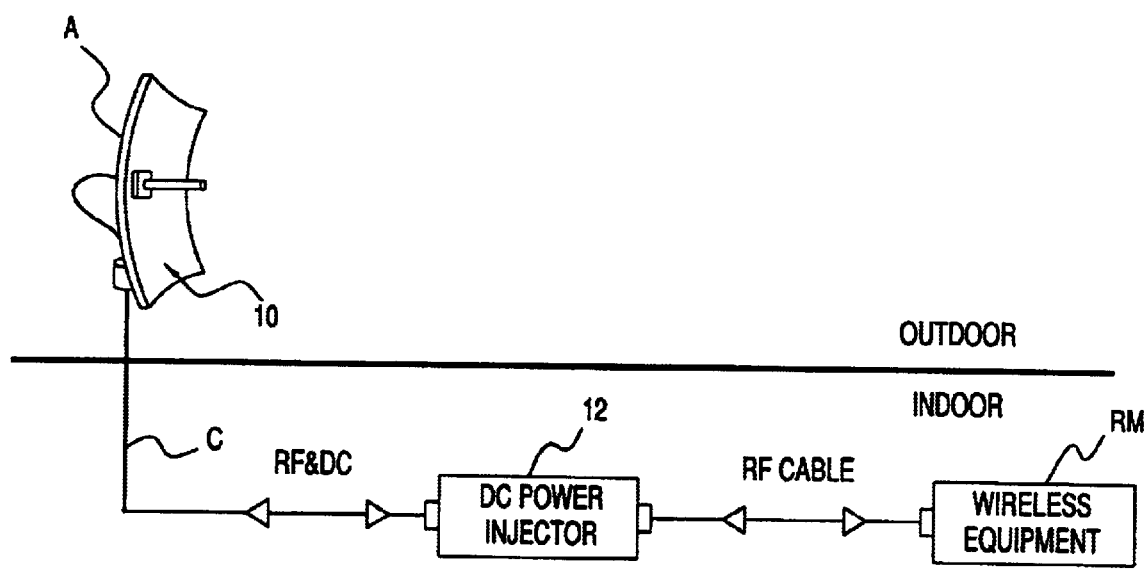
FIG. 4 is a schematic view of a typical installation of the invention.

Turning now to FIG. 4, a typical installation depicts the amplifier unit 10 mounted with U-bolts to the pole of antenna A on the exterior of a building. Bi-directional cable C communicates signals between amplifier unit 10 and DC injector 12 which is typically located in a protected environment, e.g., in a shelter or inside the building, but proximate to the radio modem RM or other wireless RF equipment.

Figure 5:
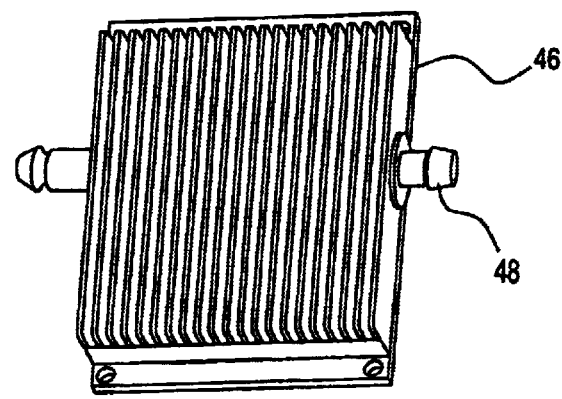
FIG. 5 is a perspective view of the illustrated embodiment of an amplifier constructed in accordance with the invention.

In FIG. 5, an exemplary housing 46 for the amplifier unit 10 is depicted. Preferably, the housing 46 for the amplifier unit 10 should be small to provide for direct mounting on an antenna A, and also possess sufficient strength and ruggedness to survive in the environment in which it is installed. The housing depicted herein is formed from cast aluminum and features fins promoting heat dissipation. Notably, the particular configuration of the heat dissipation fins are a matter of design choice. The inputs include N-type, male, 50 Ohm connectors adapted for quick connection to standard commercially available N-type, female, 50 Ohm connectors disposed on the connecting cables.

From a performance perspective, the housing should be waterproof and provide for proper operation over a wide range of temperatures and humidity. In typical North American installations, the operational temperature range should extend from sub-zero arctic temperatures to near tropical temperature maximums. Likewise, the invention contemplates full functionality at a full range of humidities. Correspondingly, the invention preferably incorporates protective features such as lighting protection circuitry and power surge protective circuitry to prevent damage from operational or environmental anomalies.

The invention allows the radio device sharing of an associated antenna in different time intervals as well as preventing transmit signal saturation.

Given the foregoing, it should be apparent that the specific described embodiments are illustrative and not intended to be limiting. Furthermore, variations and modifications to the invention should now be apparent to a person having ordinary skill in the art. These variations and modifications are intended to fall within the scope and spirit of the invention as defined by the following claims.

I claim:

1. In combination:
   an RF antenna;
   a bi-directional RF amplifier module;
   a DC injector;
   a bi-directional cable; and
   an RF modem,
   said RF amplifier module including
      an RF input power sensor,
      an RF power level detector for determining if the RF power level on said bi-directional cable is below a select threshold,
      a transmit gain control circuit responsive to the RF power level on said bi-directional cable,
      a first switch, and
      a second switch,
   said DC injector being connected to said RF amplifier module by said bi-directional cable, said cable being capable of carrying a bi-directional RF signal and DC power, where the transmit gain control circuit maintains substantially constant output power in a transmit mode, and the amplifier module switches from the transmit mode to a receive mode when the RF power is below said select threshold.

2. The combination of claim 1 where the RF input power level detector comprises a voltage comparator connected to a threshold signal source set at a select threshold and a control switch for switching between transmit and receive modes, said voltage comparator being connected to a subtractor which is also connected to a voltage reference source.

3. The combination of claim 2 where said transmit gain control circuit forms a feedback loop comprising a variable attenuator with an input from said subtractor, said variable attenuator being connected to a transmit amplifier which is connected to said first switch, said first switch being switchably connected to said antenna and connected to a bandpass filter, said bandpass filter being connected to a low noise amplifier that is connected to said second switch, said second switch including an output to said bi-directional cable which switchably connects said bi-directional cable and said variable attenuator.

4. The combination of claim 1 further comprising a power circuit connected to said second switch output.

5. The combination of claim 4 further comprising a power supply connected to said DC injector.

6. The combination of claim 1 where the transmit gain control circuit operates to maintain substantially constant output power to minimize signal distortion of said RF amplifier operating at a frequency band selected from the group of 900 MHz, 2.4 GHz, and 5.8 GHz.

7. The combination of claim 6 where the transmit gain control circuit operates according to the equation $$P_{out} = C \cdot K \cdot 10^{VR} \cdot 10^{-B \cdot Log(Pin)} \cdot P_{in} = C \cdot K \cdot 10^{VR+B}$$

where B and C are constants, K is the constant amplifier gain, VR is a fixed reference voltage, $P_{in}$ is the RF input power level, and $P_{out}$ is the output power.

8. The combination of claim 1 further comprising a lighting strike protection circuitry.

9. The combination of claim 1 further comprising a DC surge protection circuitry.

10. The method of maintaining substantially constant output power of the amplifier in a combination according to claim 1, comprising the step of operating the amplifier according to the equation $$P_{out} = C \cdot K \cdot 10^{VR} \cdot 10^{-B \cdot Log(Pin)} \cdot P_{in} = C \cdot K \cdot 10^{VR+B}$$

where B and C are constants, K is the constant amplifier gain, VR is a fixed reference voltage, $P_{in}$ is the RF input power level, and $P_{out}$ is the output power.

11. The combination of claim 1 wherein the transmit gain control circuit is responsive to the RF input power sensor.

12. A circuit for a system having a signal source, an antenna, and a bi-directional cable coupled to the signal source and the antenna, the circuit comprising:

a variable gain amplifier comprising a gain control module and a transmitting amplifier having a first input for coupling to the bi-directional cable, an output for coupling to the antenna, and a second input, wherein the variable gain amplifier amplifies an RF signal on the first input to produce an amplified signal on the output, and varies gain responsive to a signal on the second input; and a power detection module having an input for coupling to the bi-directional cable, the power detection module having an output coupled to the second input of the amplifier, wherein the power detection module is responsive to a power level on the bi-directional cable.

13. The circuit of claim 12 further including a switch coupled between the variable gain amplifier output and the antenna, the switch having a control input, and a voltage comparator having an output coupled to the control input of the switch.

14. The circuit of claim 12 wherein the variable gain amplifier includes a variable attenuator.

15. The circuit of claim 12 wherein the variable gain amplifier varies gain to maintain substantially constant output power.

16. The circuit of claim 15 wherein the variable gain amplifier maintains output power in accordance with $$P_{out} = C \cdot K \cdot 10^{VR} \cdot 10^{-B \cdot Log(Pin)} \cdot P_{in} = C \cdot K \cdot 10^{VR+B}$$

where B and C are constants, K is the constant amplifier gain of the variable gain amplifier, VR is a fixed reference voltage, $P_{in}$ is the RF input power level, and $P_{out}$ is the output power.

17. The circuit of claim 12 further comprising circuitry to protect the variable gain amplifier from lightning.

18. The circuit of claim 12 wherein the signal source includes an RF modem.

19. The circuit of claim 12 further including a signal path that passes signals between the signal source and the bi-directional cable; and a power source that sends power to the amplifier, via the signal path.

* * * * *